United States Patent
Endo

(10) Patent No.: US 8,824,192 B2
(45) Date of Patent: Sep. 2, 2014

(54) SEMICONDUCTOR DEVICE

(75) Inventor: Masami Endo, Isehara (JP)

(73) Assignee: Semiconductor Energy Laboratory Co., Ltd., Atsugi-shi, Kanagawa (JP)

( * ) Notice: Subject to any disclaimer, the term of this patent is extended or adjusted under 35 U.S.C. 154(b) by 309 days.

(21) Appl. No.: 13/455,475

(22) Filed: Apr. 25, 2012

(65) Prior Publication Data

US 2012/0281455 A1 Nov. 8, 2012

(30) Foreign Application Priority Data

May 6, 2011 (JP) ................................ 2011-103508

(51) Int. Cl.
*G11C 11/24* (2006.01)
(52) U.S. Cl.
USPC ..................... 365/149; 365/185.05
(58) Field of Classification Search
CPC . G11C 16/0466; G11C 11/223; G11C 11/404
USPC ............................................ 365/149, 185.05
See application file for complete search history.

(56) References Cited

U.S. PATENT DOCUMENTS

| | | | |
|---|---|---|---|
| 5,345,414 A * | 9/1994 | Nakamura ..................... | 365/145 |
| 5,465,249 A * | 11/1995 | Cooper et al. ................ | 365/149 |
| 5,731,856 A | 3/1998 | Kim et al. | |
| 5,744,864 A | 4/1998 | Cillessen et al. | |
| 5,942,780 A * | 8/1999 | Barsan et al. ............. | 365/185.1 |
| 6,028,758 A | 2/2000 | Sharpe-Geisler | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,017,662 B2 | 3/2006 | Schultz et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |

(Continued)

FOREIGN PATENT DOCUMENTS

| CN | 101095239 | 12/2007 |
|---|---|---|
| CN | 101997004 | 3/2011 |

(Continued)

OTHER PUBLICATIONS

International Search Report (Application No. PCT/JP2012/002795) Dated May 29, 2012.

(Continued)

*Primary Examiner* — Tuan T Nguyen
(74) *Attorney, Agent, or Firm* — Eric J. Robinson; Robinson Intellectual Property Law Office, P.C.

(57) ABSTRACT

A semiconductor device that has a simple peripheral circuit configuration, is unlikely to deteriorate due to repetitive data writing operations, and is used as a nonvolatile switch. Even when supply of a power supply voltage is stopped, data on a conduction state is held in a data retention portion connected to a thin film transistor including an oxide semiconductor layer having a channel formation region. The data retention portion is connected to a gate of a field-effect transistor in a current amplifier circuit (in which the field-effect transistor and a bipolar transistor are connected as a Darlington pair), and thus the conduction state is controlled without leaking charge in the data retention portion.

14 Claims, 8 Drawing Sheets

(56) References Cited

U.S. PATENT DOCUMENTS

| | | | |
|---|---|---|---|
| 7,282,782 | B2 | 10/2007 | Hoffman et al. |
| 7,297,977 | B2 | 11/2007 | Hoffman et al. |
| 7,301,223 | B2 | 11/2007 | Rodney et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,442,932 | B2 | 10/2008 | Schultz et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,054,668 | B2 * | 11/2011 | Harris .................... 365/104 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0099859 | A1 * | 5/2005 | Diorio et al. .................... 365/200 |
| 2005/0104104 | A1 | 5/2005 | Schultz et al. |
| 2005/0104176 | A1 | 5/2005 | Rodney et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0151599 | A1 * | 6/2008 | Nishinohara et al. ......... 365/145 |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0059684 | A1 * | 3/2009 | Harris ..................... 365/189.07 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0031498 | A1 | 2/2011 | Kimura et al. |
| 2011/0260158 | A1 | 10/2011 | Takemura |
| 2012/0026632 | A1 | 2/2012 | Acharya et al. |
| 2012/0039126 | A1 | 2/2012 | Saito |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 62-219667 A | 9/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-313999 A | 11/2006 |
| JP | 2007-519228 | 7/2007 |
| JP | 2011-054951 A | 3/2011 |
| WO | WO-2004/114391 | 12/2004 |
| WO | WO-2005/049957 | 6/2005 |
| WO | WO-2005/050257 | 6/2005 |
| WO | WO-2005/050714 | 6/2005 |
| WO | WO-2005/050777 | 6/2005 |
| WO | WO-2005/059955 | 6/2005 |

OTHER PUBLICATIONS

Written Opinion (Application No. PCT/JP2012/002795) Dated May 29, 2012.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of SOL-GEL-Derived Zinc Oxide Films by Irradiation With Ultraviolet Lamp,", Journal of SOL-GEL Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-IN. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-ZnOxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA AMOLED Display Using IN-GA-ZN-Oxide TFTS With a Novel Passivation Layer,", SID Digest '09 : SID International Symposium Digest of Technical Papers, May 31, 2009. pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; Fe, Ga, Or Al; B: Mg, Mn, Fe, Ni, Cu,OR Zn] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner c-axis direction
charge 0 charge +1 charge 0
ab plane charge −1 charge 0

FIG. 7A  FIG. 7B
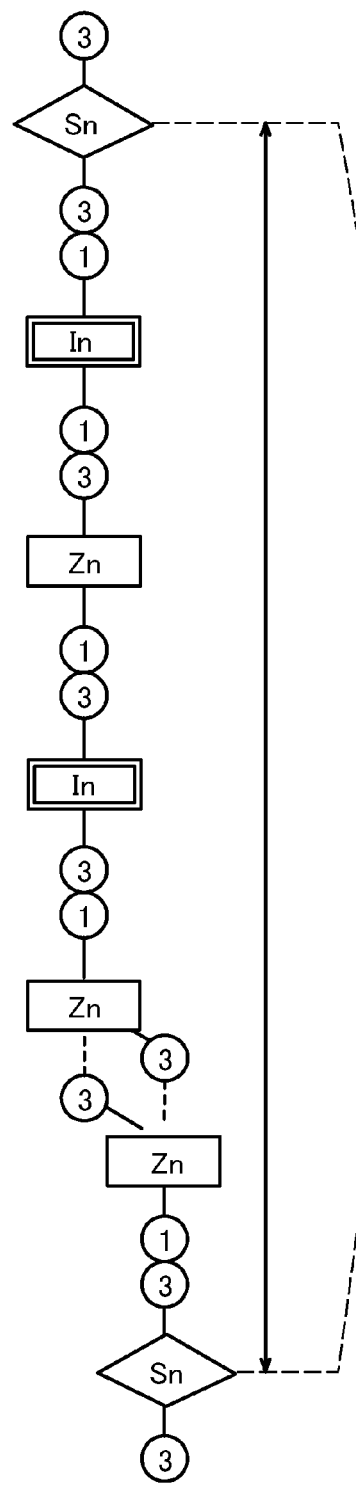
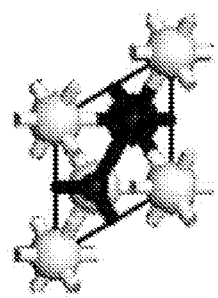
FIG. 7C
- In
- Sn
- Zn
- O

● In
○ Ga
○ Zn
● O

SEMICONDUCTOR DEVICE

TECHNICAL FIELD

The present invention relates to semiconductor devices, particularly to a semiconductor device that can keep data on a conduction state even when power is off.

BACKGROUND ART

A dual in-line package (DIP) switch is known as a small switch with nonvolatility (referred to as nonvolatile switch) that can store data on a conduction state which has been set even when power is off. Since electronic components are being reduced in size in recent years, DIP switches are being replaced with nonvolatile switches that are electrically controlled by using nonvolatile memories such as a flash memory.

For a nonvolatile switch using a nonvolatile memory, a structure including a phase-change memory is proposed (e.g., see Patent Document 1) as well as a structure including a flash memory. In the structure in Patent Document 1, data on a conduction state is stored in a phase-change memory, and the data on the conduction state can be held even when power is off.

REFERENCE

Patent Document 1: Japanese Published Patent Application No. 2006-313999

DISCLOSURE OF INVENTION

In the structure disclosed in Patent Document 1, a phase-change material is used for realizing a nonvolatile switch. Thus, at the time of data writing, it is necessary to promote the phase change due to heat by supplying current to the phase-change material. For that reason, a nonvolatile switch into which data is written by supply of current additionally requires a circuit that generates current for writing data, leading to complication of the peripheral circuit configuration.

In addition, a nonvolatile switch into which data is written by supply of current has a problem of deterioration due to repetitive writing operations.

In view of the above, an object of one embodiment of the present invention is to provide a semiconductor device that has a simple peripheral circuit configuration, is unlikely to deteriorate due to repetitive data writing operations, and is used as a nonvolatile switch.

In one embodiment of the present invention, even when supply of a power supply voltage is stopped, data on a conduction state of a nonvolatile switch is held in a data retention portion connected to a thin film transistor having a channel formation region in an oxide semiconductor layer. The data retention portion is connected to a gate of a field-effect transistor in a current amplifier circuit (in which the field-effect transistor and a bipolar transistor are connected as a Darlington pair), and thus data on the conduction state is output without leaking charge in the data retention portion.

According to one embodiment of the present invention, a semiconductor device includes a thin film transistor to which a data signal is supplied through a first terminal and which includes an oxide semiconductor layer having a channel formation region; and a current amplifier circuit including a field-effect transistor and a bipolar transistor connected as a Darlington pair. The data is held in a data retention portion where a second terminal of the thin film transistor, a gate of the field-effect transistor, and one of electrodes of a capacitor are electrically connected to each other, by turning off the thin film transistor. The amount of current flowing through the current amplifier circuit is controlled in accordance with the data held in the data retention portion.

In the semiconductor device according to one embodiment of the present invention, the data signal is a signal selected from a high power supply potential and a ground potential, and the data signal is preferably kept at the ground potential in a period during which the thin film transistor is off.

In the semiconductor device according to one embodiment of the present invention, a gate terminal of the thin film transistor is preferably connected to a wiring supplied with a control signal for controlling a conduction state of the thin film transistor.

In the semiconductor device according to one embodiment of the present invention, the control signal is a signal selected from the high power supply potential and the ground potential, and the control signal is preferably kept at the ground potential in a period during which the thin film transistor is off.

In the semiconductor device according to one embodiment of the present invention, the oxide semiconductor layer preferably contains an In—Sn—Zn—O-based oxide semiconductor.

One embodiment of the present invention can provide a semiconductor device that has a simple peripheral circuit configuration, is unlikely to deteriorate due to repetitive data writing operations, and is used as a nonvolatile switch.

BRIEF DESCRIPTION OF DRAWINGS

In the accompanying drawings:

FIGS. 7A to 7C illustrate a structure of an oxide material according to one embodiment of the present invention.

BEST MODE FOR CARRYING OUT THE INVENTION

Figure 1:
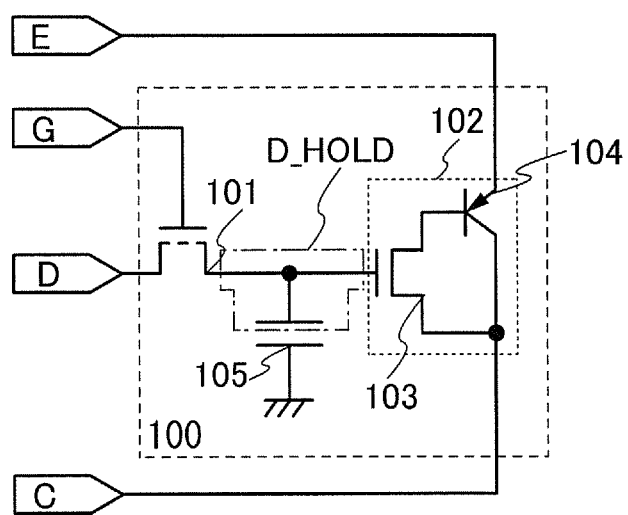
FIG. 1 is a circuit diagram of a semiconductor device.

Embodiments of the present invention will be hereinafter described with reference to the accompanying drawings. Note that the present invention can be carried out in many different modes, and it is easily understood by those skilled in the art that the mode and details can be variously changed without departing from the scope and spirit of the present invention. Therefore, the present invention should not be construed as being limited to the description of the embodiments. Note that in the structures of the present invention described below, reference numerals denoting the same portions are used in common in different drawings.

Note that the size, the layer thickness, the signal waveform, or a region of each component illustrated in drawings and the like in embodiments is exaggerated for clarity in some cases. Therefore, embodiments of the present invention are not limited to such scales.

Note that when it is explicitly described that "A and B are connected," the case where A and B are electrically connected, the case where A and B are functionally connected, and the case where A and B are directly connected are included therein.

Note that in this specification, the terms "first", "second", "third", to "n-th" (n is a natural number) are used in order to avoid confusion between components and thus do not limit the number of the components.

(Embodiment 1)

A semiconductor device described in this embodiment can be a circuit that can function as a nonvolatile switch, in particular, a nonvolatile switch through which a large amount of current can flow. This embodiment describes a circuit configuration and operation of a semiconductor device that can be electrically controlled and functions as a nonvolatile switch.

FIG. 1 is a circuit diagram of a semiconductor device functioning as a nonvolatile switch. A semiconductor device 100 illustrated in FIG. 1 controls a conduction state of a thin film transistor 101 in accordance with a selection signal G, and can hold data in a data signal D input from the outside in a data retention portion D_HOLD. A current amplifier circuit 102 including a Darlington circuit can supply current toward a collector C in response to the increase in the potential of an emitter E, in accordance with the data held in the data retention portion D_HOLD of the semiconductor device 100.

Next, a specific example of the circuit configuration will be described. The semiconductor device 100 in FIG. 1 includes the thin film transistor 101 and the current amplifier circuit 102. The current amplifier circuit 102 includes a field-effect transistor 103 and a bipolar transistor 104. The semiconductor device 100 also includes a capacitor 105 for holding data.

Note that the circuit symbol of the thin film transistor 101 in FIG. 1 is a circuit symbol for indicating a transistor including an oxide semiconductor layer having a channel formation region.

The current amplifier circuit 102 includes the field-effect transistor 103 and the bipolar transistor 104 which are connected as a Darlington pair as illustrated in FIG. 1. In the following description, the field-effect transistor 103 is an n-channel field-effect transistor and the bipolar transistor 104 is a PNP bipolar transistor; however, there is no particular limitation on the conductivity type or the like as long as the transistors are connected as a Darlington pair.

One of a source electrode and a drain electrode (a first terminal) of the thin film transistor 101 is connected to a data signal line for supplying the data signal D. A gate electrode (a gate terminal) of the thin film transistor 101 is connected to a selection signal line for supplying the selection signal G.

A gate terminal of the field-effect transistor 103 is connected to the other of the source electrode and the drain electrode (a second terminal) of the thin film transistor 101 and one of electrodes of the capacitor 105.

A base terminal of the bipolar transistor 104 is connected to a first terminal of the field-effect transistor 103. An emitter terminal of the bipolar transistor 104 is connected to a wiring for supplying a high power supply potential (the emitter E in FIG. 1). A collector terminal of the bipolar transistor 104 is connected to a wiring for supplying a low power supply potential (the collector C in FIG. 1) and a second terminal of the field-effect transistor 103.

In FIG. 1, a wiring to which the second terminal of the thin film transistor 101, the one electrode of the capacitor 105, and the gate terminal of the field-effect transistor 103 are connected (a region surrounded by a dashed line in FIG. 1) is the data retention portion D_HOLD.

Since the data retention portion D_HOLD is an element in which the gate terminal of the field-effect transistor 103 and the one electrode of the capacitor 105 are surrounded by an insulator, charge hardly leaks from the field-effect transistor 103 and the capacitor 105. For that reason, by reducing the off-state current of the thin film transistor 101 in a non-conducting state as much as possible, a potential can be held in the data retention portion D_HOLD.

Note that in the configuration in FIG. 1, the gate capacitance of the field-effect transistor 103 can be actively used, in which case the capacitor 105 can be omitted.

As described above, in this embodiment, the off-state current of the thin film transistor 101 in a non-conducting state is made as low as possible to hold data in the data retention portion D_HOLD. A specific example of a thin film transistor with extremely low off-state current is a thin film transistor including an oxide semiconductor layer having a channel formation region.

An oxide semiconductor contains at least one element selected from In, Ga, Sn, and Zn. For example, any of the following oxide semiconductors can be used: an oxide of four metal elements, such as an In—Sn—Ga—Zn—O-based oxide semiconductor; an oxide of three metal elements, such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Hf—In—Zn—O-based oxide semiconductor, and a Sn—Al—Zn—O-based oxide semiconductor; an oxide of two metal elements, such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor; and an oxide of one metal element, such as an In—O-based oxide semiconductor, a Sn—O-based oxide semiconductor, and a Zn—O-based oxide semiconductor. In addition, any of the above oxide semiconductors may contain an element other than In, Ga, Sn, and Zn, for example, $SiO_2$.

For example, an In—Ga—Zn—O-based oxide semiconductor refers to an oxide semiconductor containing indium (In), gallium (Ga), and zinc (Zn), and there is no limitation on the composition ratio thereof. Particularly in the case of using an In—Sn—Zn—O-based oxide semiconductor as the oxide semiconductor, the mobility of a thin film transistor can be increased. Further, the use of an In—Sn—Zn—O-based oxide semiconductor allows the threshold voltage of a thin film transistor to be stably controlled.

As the oxide semiconductor, a thin film represented by the chemical formula, $InMO_3(ZnO)_m$ (m>0) can be used. Here, M represents one or more metal elements selected from Zn, Ga, Al, Mn, and Co. For example, M can be Ga, Ga and Al, Ga and Mn, or Ga and Co.

In the case where an In—Zn—O-based material is used as the oxide semiconductor, a target therefor has a composition ratio of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

In the case where an In—Sn—Zn—O-based oxide semiconductor is used, a target may have a composition ratio of In:Sn:Zn=1:2:2, In:Sn:Zn=2:1:3, or In:Sn:Zn=1:1:1 in an atomic ratio, for example.

In particular, in a thin film transistor whose channel is formed in an oxide semiconductor layer that is highly purified by drastic removal of hydrogen contained in the oxide semiconductor layer, the off-state current density can be 100 zA/μm or less, preferably 10 zA/μm or less, further preferably 1 zA/μm or less. Thus, the off-state current of the above thin film transistor is extremely lower than that of a thin film transistor containing crystalline silicon. Consequently, the potential of the data retention portion D_HOLD can be held for a long time while the thin film transistor 101 having the channel formation region in the oxide semiconductor layer is off.

Note that in this specification, the off-state current is a current flowing between the source and the drain when a transistor is off (is in a non-conducting state). In an n-channel transistor (with a threshold voltage of about 0 to 2 V, for example), the off-state current refers to a current flowing between the source and the drain when negative voltage is applied between the gate and the source.

Note that a material that can realize off-state current characteristics equivalent to those of the oxide semiconductor material may be used for a semiconductor layer of the thin film transistor instead of the oxide semiconductor material. For example, a wide gap material like silicon carbide (more specifically, a semiconductor material whose energy gap Eg is larger than 3 eV) can be used.

Figure 2A:
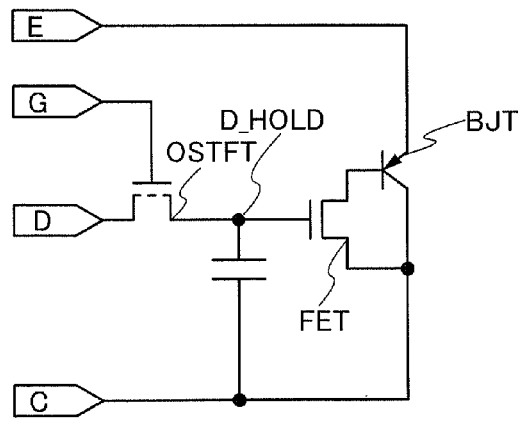
FIGS. 2A and 2B are a circuit diagram and a timing chart of a semiconductor device.
Figure 2B:
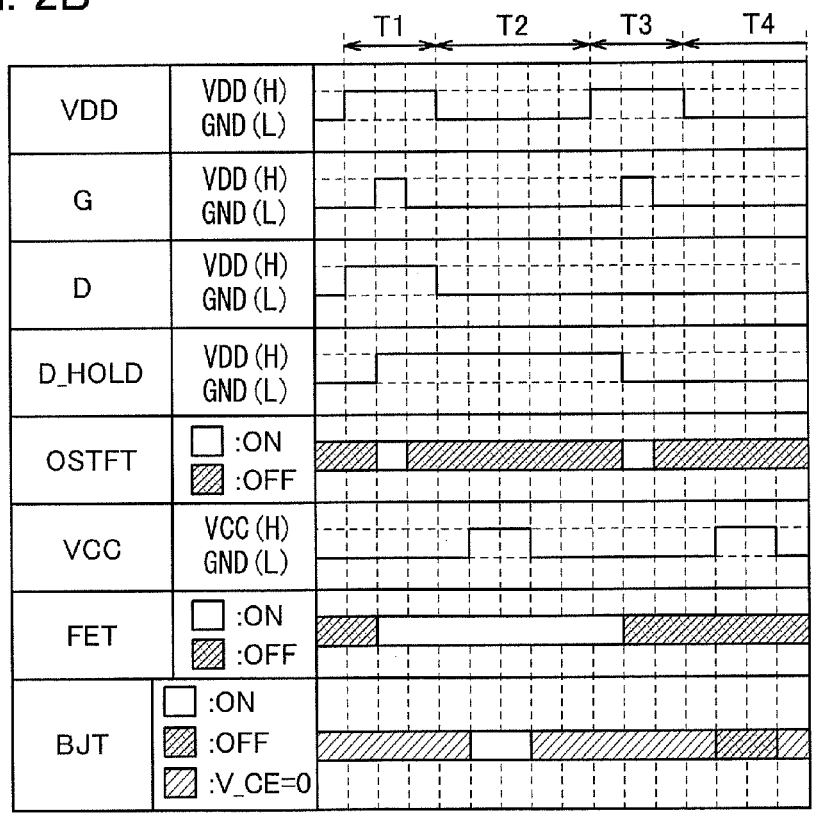

FIG. 2A illustrates the elements included in the semiconductor device 100 with shortened names in order to explain the operation of the semiconductor device 100 in FIG. 1. FIG. 2B is a timing chart illustrating how the operation of each element in FIG. 2A is changed by input of signals.

In FIG. 2A, the thin film transistor 101 in FIG. 1 is designated as OSTFT; the potential of the data retention portion D_HOLD in FIG. 1, D_HOLD; the field-effect transistor 103 in FIG. 1, FET; and the bipolar transistor 104 in FIG. 1, BJT.

FIG. 2A illustrates a structure in which the other electrode of the capacitor 105 in FIG. 1 is connected to the collector C, which is the wiring for supplying a low power supply potential VSS. In the following description, the low power supply potential VSS is a ground potential GND.

In the semiconductor device 100 described in this embodiment, supply of the power supply voltage to a circuit that supplies the data signal D and the selection signal G can be stopped. The thin film transistor needs to be kept off while supply of the power supply voltage is stopped.

Given that the high power supply potential of the data signal D and the selection signal G is VDD and the low power supply potential thereof is GND, in order to stop supply of the power supply voltage, the potential of the wiring supplied with the high power supply potential VDD is lowered to GND, the low power supply potential. Alternatively, given that the high power supply potential of the data signal D and the selection signal G is VDD and the low power supply potential thereof is VSS, in order to stop supply of the power supply voltage, both the potential of the wiring supplied with the high power supply potential VDD and the potential of the wiring supplied with the low power supply potential VSS are lowered to GND.

Figure 3A:
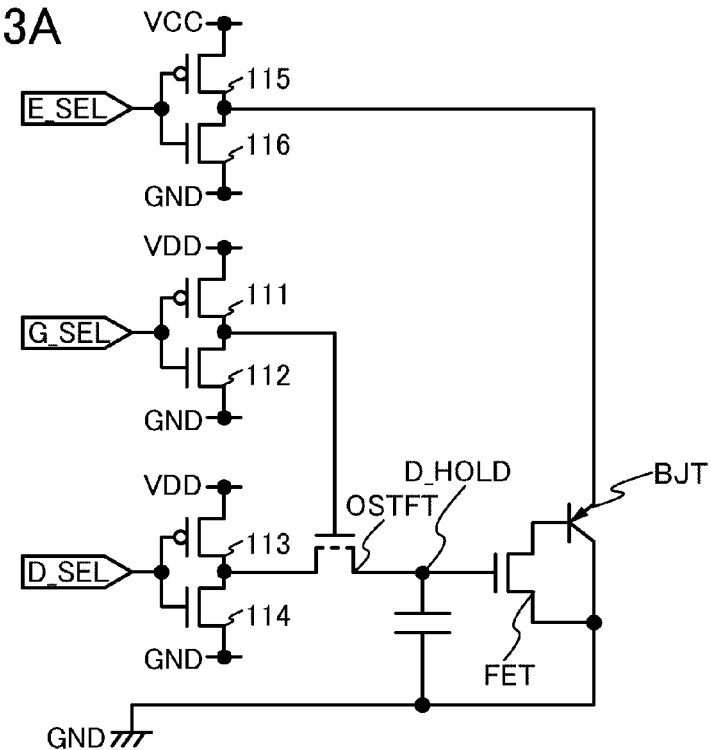
FIGS. 3A and 3B are circuit diagrams of semiconductor devices.

In other words, using the circuit illustrated in FIG. 3A and inputting a signal G_SEL for controlling the potential of the selection signal G to gate terminals of a p-channel transistor 111 and an n-channel transistor 112 that constitute a complementary circuit, the potential of the selection signal G is controlled. Accordingly, when supply of the power supply voltage is stopped, the potential GND is applied to the gate terminal of the thin film transistor 101 and the thin film transistor 101 is kept off.

Similarly, using the circuit illustrated in FIG. 3A and inputting a signal D_SEL for controlling the potential of the data signal D to gate terminals of a p-channel transistor 113 and an n-channel transistor 114 that constitute a complementary circuit, the potential of the data signal D is controlled. Accordingly, when supply of the power supply voltage is stopped, the potential GND can be applied to the first terminal of the thin film transistor 101.

Further, using the circuit illustrated in FIG. 3A and inputting a signal E_SEL for controlling the potential of the emitter E to gate terminals of a p-channel transistor 115 and an n-channel transistor 116 that constitute a complementary circuit, the potential of the emitter E is controlled. A high power supply potential VCC for supplying the potential of the emitter E is controlled independently of the high power supply potential VDD, so that the high power supply voltage VCC can be supplied to the current amplifier circuit 102 even when supply of the high power supply potential VDD is stopped.

Figure 3B:
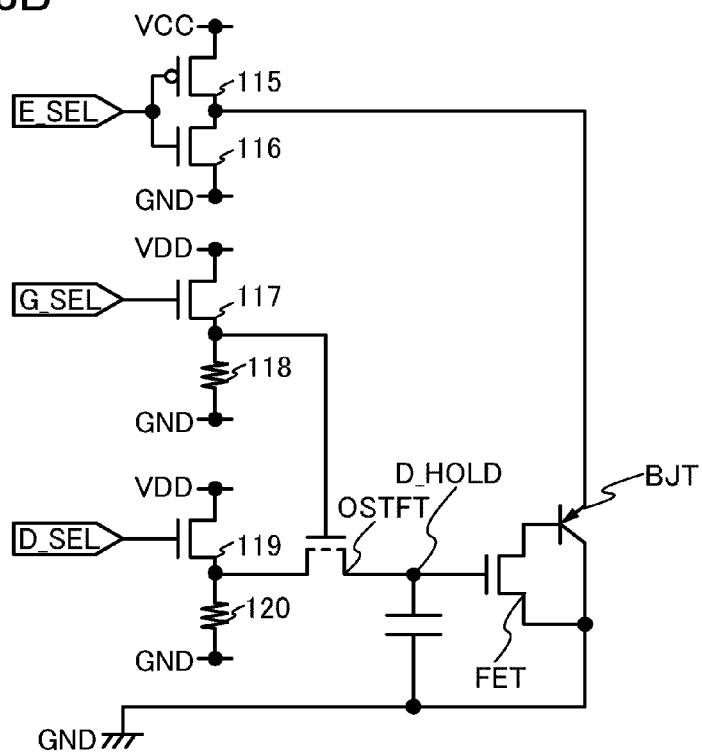

Note that the signal G_SEL for controlling the potential of the selection signal G can be input to a circuit composed of an n-channel transistor 117 and a resistor 118 illustrated in FIG. 3B to control the potential of the selection signal G. In that case, when supply of the power supply voltage is stopped, the potential GND can be supplied to the gate terminal of the thin film transistor 101 regardless of the potential of the signal G_SEL.

Similarly, the signal D_SEL for controlling the potential of the data signal D can be input to a circuit composed of an n-channel transistor 119 and a resistor 120 illustrated in FIG. 3B to control the potential of the data signal D. In that case, when supply of the power supply voltage is stopped, the potential GND can be supplied to the first terminal of the thin film transistor 101 regardless of the potential of the signal D_SEL.

Next, the operation of the semiconductor device 100 will be described with reference to the timing chart in FIG. 2B.

In the timing chart in FIG. 2B, VDD, G, D, D_HOLD, OSTFT, VCC, FET, and BJT correspond to the input/output signals, the potentials of the wirings, and the elements illustrated in FIGS. 2A and 3A. In addition, the timing chart in FIG. 2B shows periods T1 to T4 in order to explain a plurality of possible states of the semiconductor device 100.

In the following description of the operation in FIG. 2B, the conductivity types of the transistors and the logic circuit are the same as those in FIGS. 2A and 3A. Note that without limitation to the above, the conductivity types of the transistors and the potential of each signal can be set as appropriate as long as the operation is totally the same as above. Each of the signals can be represented by an H signal (VDD) and an L signal (GND). In the description of FIG. 2B, the initial potential of the data retention portion D_HOLD is GND.

Note that in the timing chart, each of the signals is represented by the H signal and the L signal; the potentials of the H signal and the L signal may vary between the signals. For example, the H signal of the selection signal G may be set higher than the H signal of the data signal D, in which case the reduction in the potential of the thin film transistor 101 by the threshold voltage can be suppressed.

The high power supply potential VCC supplied to the emitter E is preferably higher than the high power supply potential VDD of the selection signal G and the data signal D, in which case the amplification of current in the current amplifier circuit 102 can be easily controlled.

The operation in the period T1 in FIG. 2B will be described. The period T1 is a period for feeding the data signal D which is the H signal into the data retention portion D_HOLD.

In the period T1, the high power supply potential for supplying the selection signal G and the data signal D is set to VDD, and the H signal is input as the selection signal G and the data signal D. When the selection signal G (the H signal) is input to the OSTFT, OSTFT is turned on (ON), and the data signal D (the H signal) is fed into the data retention portion D_HOLD. FET is turned on when the potential of the data retention portion D_HOLD becomes the H signal; at this time, the potential of the emitter E is GND and current does not flow, which means that BJT is off (OFF).

The operation in the period T2 in FIG. 2B will be described. The period T2 is a period during which the H signal can be held in the data retention portion D_HOLD even after the high power supply potential VDD of the selection signal G and the data signal D is set to GND, and current flows from the emitter E.

In the period T2, the high power supply potential VDD for supplying the selection signal G and the data signal D is set to GND, and the L signal is input as the selection signal G and the data signal D. At this time, OSTFT can be kept off. Thus, the data retention portion D_HOLD holds the H signal, which is fed in the previous period T1, even when supply of the power supply voltage is stopped. FET is on while the data retention portion D_HOLD holds the H signal. At this time, by setting the potential of the emitter E to VCC, which is the H signal, BJT is brought into a conducting state where a base current and a collector current flows therethrough, and the current can be amplified.

The operation in the period T3 in FIG. 2B will be described. The period T3 is a period for feeding the data signal D which is the L signal into the data retention portion D_HOLD.

In the period T3, the high power supply potential for supplying the selection signal G is set to VDD, and the H signal is input as the selection signal G. The potential of the data signal D is set to GND. At this time, when the selection signal G (the H signal) is input to OSTFT, OSTFT is turned on, and the data signal D (the L signal) is fed into the data retention portion D_HOLD. FET is turned off when the potential of the data retention portion D_HOLD becomes the L signal; at this time, the potential of the emitter E is GND and current does not flow, which means that BJT is off (OFF).

The operation in the period T4 in FIG. 2B will be described. The period T4 is a period during which the L signal can be held in the data retention portion D_HOLD even after the high power supply potential VDD of the selection signal G and the data signal D is set to GND, and current does not flow from the emitter E.

In the period T4, the high power supply potential VDD for supplying the selection signal G is set to GND, and the L signal is input as the selection signal G and the data signal D. At this time, OSTFT can be kept off. Thus, the data retention portion D_HOLD holds the L signal, which is fed in the previous period T3, even when supply of the power supply voltage is stopped. FET is off while the data retention portion D_HOLD holds the L signal. At this time, BJT is brought into a non-conducting state where a base current and a collector current do not flow therethrough even when the potential of the emitter E is set to VCC, which is the H signal.

The above is the description of the operation of the semiconductor device 100.

As described above, in one embodiment of the present invention, data on the conduction state of the semiconductor device is held in the data retention portion connected to the thin film transistor having a channel formation region in an oxide semiconductor layer even when supply of the power supply voltage is stopped. Consequently, the semiconductor device according to one embodiment of the present invention can serve as a nonvolatile switch in which a switching operation of the current amplifier circuit is changed by switching the on/off state of the thin film transistor to control the potential held in the data retention portion.

In addition, in the semiconductor device according to one embodiment of the present invention, it is not necessary to apply a high voltage of 10 V or more to a storage element for data writing or to additionally provide a circuit for generating current needed for data writing; this means that a peripheral circuit does not need to be additionally provided. Moreover, the semiconductor device according to one embodiment of the present invention is configured to serve as a nonvolatile switch in which a switching operation of the current amplifier circuit is changed while a given potential is held in the data retention portion; thus, deterioration due to repetitive writing operations can be reduced as compared to a flash memory, a phase-change memory, and the like.

This embodiment can be implemented in combination with another embodiment as appropriate.

(Embodiment 2)

In this embodiment, an example of a structure of a transistor that can be used in the semiconductor device in Embodiment 1 will be described. Specifically, a description is given of examples of a structure and a manufacturing process of the thin film transistor 101 in the case where the thin film transistor 101 is miniaturized in the configuration in Embodiment 1.

In particular, this embodiment explains, as an example of the structure of the thin film transistor, a structure in which regions serving as a source and drain regions in an active layer including a channel formation region containing an oxide semiconductor are formed by adding an impurity into the oxide semiconductor such that the resistance of the source and drain regions is lower than that of the channel formation region. Note that the resistance of the impurity regions is lower than that of the channel formation region.

FIGS. 4A to 4D are cross-sectional views of the thin film transistor 101. The transistor structures illustrated in FIGS. 4A to 4D are top-gate structures. Such a top-gate structure of the thin film transistor 101 in which a source and drain regions are formed in a self-aligned manner using a gate electrode as illustrated in FIGS. 4A to 4D leads to miniaturization of the transistor. Consequently, there is no overlap between the gate electrode and a source or drain electrode of the transistor, so that the gate capacitance can be reduced. Thus, power consumed by charge necessary for charging and discharging can be reduced.

Figure 4A:
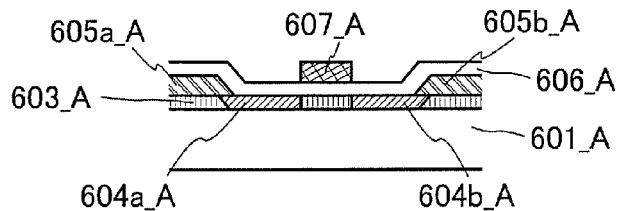
FIGS. 4A to 4D are cross-sectional views each illustrating a structure of a semiconductor device.

The thin film transistor illustrated in FIG. 4A includes a semiconductor layer 603_A, a conductive layer 605a_A, a conductive layer 605b_A, an insulating layer 606_A, and a conductive layer 607_A.

The semiconductor layer 603_A includes a high-concentration region 604a_A and a high-concentration region 604b_A with a space provided therebetween. The region between the high-concentration region 604a_A and the high-concentration region 604b_A is a channel formation region. The semiconductor layer 603_A is provided, for example, over an insulating layer 601_A. Note that a high-concentration region refers to a region whose resistance is decreased by dopant added at a high concentration, and a low-concentration region refers to a region whose resistance is decreased by a dopant added at a low concentration.

The conductive layer 605a_A and the conductive layer 605b_A are provided over the semiconductor layer 603_A and electrically connected to the semiconductor layer 603_A. For example, the conductive layers 605a_A and 605b_A are in contact with part of the semiconductor layer 603_A. Further, side surfaces of the conductive layers 605a_A and 605b_A are tapered, and the conductive layers 605a_A and 605b_A overlap with part of the high-concentration region 604a_A and part of the high-concentration region 604b_A, respectively.

The insulating layer 606_A is provided over the semiconductor layer 603_A, the conductive layer 605a_A, and the conductive layer 605b_A.

The conductive layer 607_A overlaps with part of the semiconductor layer 603_A between the high-concentration region 604a_A and the high-concentration region 604b_A, with the insulating layer 606_A placed therebetween. The part of the semiconductor layer 603_A which overlaps with the conductive layer 607_A with the insulating layer 606_A placed therebetween is the channel formation region.

Figure 4B:
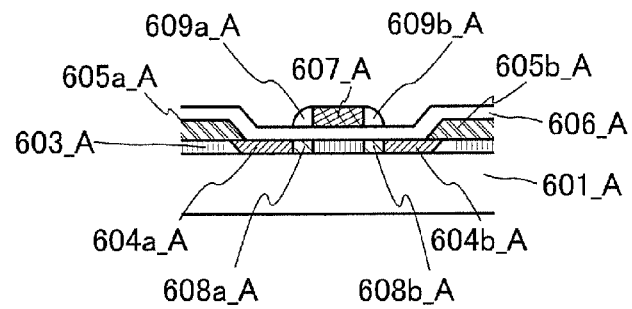

The transistor illustrated in FIG. 4B includes an insulating layer 609a_A and an insulating layer 609b_A serving as sidewalls in addition to the components illustrated in FIG. 4A, and also includes a low-concentration region 608a_A and a low-concentration region 608b_A between the high-concentration region 604a_A and the high-concentration region 604b_A in the semiconductor layer 603_A.

The insulating layers 609a_A and 609b_A are provided over the insulating layer 606_A and in contact with the respective opposite side surfaces of the conductive layer 607_A.

The low-concentration region 608a_A and the low-concentration region 608b_A overlap with the insulating layer 609a_A and the insulating layer 609b_A, respectively, with the insulating layer 606_A placed therebetween. The impurity concentration of the low-concentration regions 608a_A and 608b_A is lower than that of the high-concentration regions 604a_A and 604b_A.

With the low-concentration regions 608a_A and 608b_A, local electric field concentration on the transistor can be suppressed, increasing the reliability of the transistor.

Figure 4C:
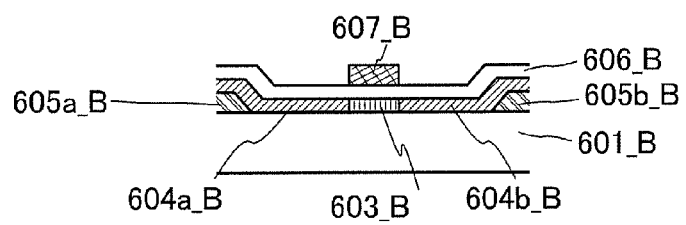

The transistor illustrated in FIG. 4C includes a semiconductor layer 603_B, a conductive layer 605a_B, a conductive layer 605b_B, an insulating layer 606_B, and a conductive layer 607_B.

The conductive layer 605a_B and the conductive layer 605b_B are provided over an insulating layer 601_B and electrically connected to a high-concentration region 604a_B and a high-concentration region 604b_B, respectively. For example, the conductive layer 605a_B and the conductive layer 605b_B are in contact with part of the high-concentration region 604a_B and part of the high-concentration region 604b_B, respectively. Further, side surfaces of the conductive layers 605a_B and 605b_B are tapered, and the conductive layer 605a_B and the conductive layer 605b_B overlap with part of the high-concentration region 604a_B and part of the high-concentration region 604b_B, respectively.

The semiconductor layer 603_B includes the high-concentration region 604a_B and the high-concentration region 604b_B with a space therebetween. The region between the high-concentration region 604a_B and the high-concentration region 604b_B is a channel formation region. The semiconductor layer 603_B is provided over the conductive layer 605a_B, the conductive layer 605b_B, and the insulating layer 601_B, for example.

The insulating layer 606_B is provided over the semiconductor layer 603_B, the high-concentration region 604a_B, and the high-concentration region 604b_B.

The conductive layer 607_B overlaps with the semiconductor layer 603_B with the insulating layer 606_B placed therebetween. The semiconductor layer 603_B which overlaps with the conductive layer 607_B with the insulating layer 606_B placed therebetween is the channel formation region.

Figure 4D:
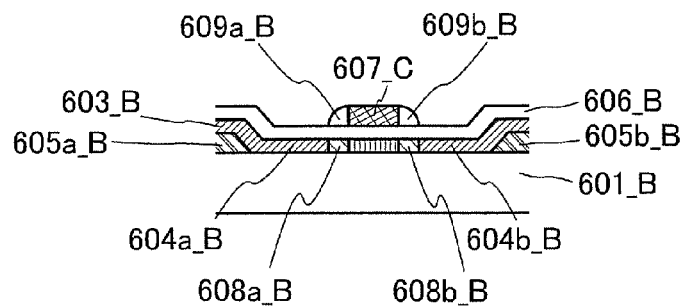

The transistor illustrated in FIG. 4D includes an insulating layer 609a_B and an insulating layer 609b_B serving as sidewalls in addition to the components illustrated in FIG. 4C, and also includes a low-concentration region 608a_B and a low-concentration region 608b_B between the high-concentration region 604a_B and the high-concentration region 604b_B in the semiconductor layer 603_B.

The insulating layer 609a_B and the insulating layer 609b_B are provided over the insulating layer 606_B and in contact with the respective opposite side surfaces of a conductive layer 607_C.

The low-concentration regions 608a_B and 608b_B overlap with the insulating layers 609a_B and 609b_B, respectively, with the insulating layer 606_B placed therebetween. The impurity concentration of the low-concentration regions 608a_B and 608b_B is lower than that of the high-concentration regions 604a_B and 604b_B.

With the low-concentration regions 608a_B and 608b_B, local electric field concentration on the transistor can be suppressed, increasing the reliability of the transistor.

In addition, the components illustrated in FIGS. 4A to 4D will be described.

As the insulating layers 601_A and 601_B, a single layer or a stack of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and/or a hafnium oxide layer can be used, for example. The insulating layers 601_A and 601_B are preferably formed using a material with which surfaces of the insulating layers can be processed to be flat.

The semiconductor layers 603_A and 603_B each function as a channel formation layer of the transistor. As the semiconductor layers 603_A and 603_B, an oxide semiconductor layer containing an oxide of four metal elements, an oxide of three metal elements, or an oxide of two metal elements can be used, for example.

As the oxide of four metal elements, an In—Sn—Ga—Zn—O-based metal oxide can be used, for example.

As the oxide of three metal elements, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Hf—In—Zn—O-based metal oxide, or a Sn—Al—Zn—O-based metal oxide can be used, for example As the oxide of two metal elements, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

As the semiconductor layers 603_A and 603_B, a layer containing an In—O-based metal oxide, a Sn—O-based metal oxide, or a Zn—O-based metal oxide can be used, for example. The metal oxide that can be used as the oxide semiconductor may contain silicon oxide. Further, the metal oxide that can be used as the oxide semiconductor may contain nitrogen.

As the semiconductor layers 603_A and 603_B, a layer containing a material represented by InLO$_3$(ZnO)$_m$ (m is a number greater than 0) can be used. Here, L in InLO$_3$(ZnO)$_m$ represents one or more metal elements selected from Ga, Al, Mn, and Co.

Note that the mobility of the transistor can be increased particularly when an In—Sn—Zn—O-based oxide semiconductor is used for the semiconductor layers 603_A and 603_B. Further, the use of an In—Sn—Zn—O-based oxide semiconductor allows the threshold voltage of the transistor to be stably controlled.

The high-concentration regions 604a_A, 604b_A, 604a_B, and 604b_B function as a source or a drain of the transistor. Note that a region functioning as a source of a transistor can be called a source region, and a region functioning as a drain of a transistor can be called a drain region.

The resistance of the low-concentration regions 608a_A, 608b_A, 608a_B, and 608b_B is higher than that of the high-concentration regions 604a_A, 604b_A, 604a_B, and 604b_B; thus, the low-concentration regions 608a_A, 608b_A, 608a_B, and 608b_B are also referred to as high-resistance impurity regions.

As the dopant added into the high-concentration regions 604a_A, 604b_A, 604a_B, and 604b_B and the low-concentration regions 608a_A, 608b_A, 608a_B, and 608b_B, one or more of nitrogen, phosphorus, arsenic, argon, xenon, helium, and hydrogen can be used, for example.

The concentration of the dopant in the high-concentration regions 604a_A, 604b_A, 604a_B, and 604b_B is preferably greater than or equal to $5 \times 10^{19}$ cm$^{-3}$, for example.

The concentration of the dopant in the low-concentration regions 608a_A, 608b_A, 608a_B, and 608b_B is preferably, for example, greater than or equal to $5 \times 10^{18}$ cm$^{-3}$ and less than $5 \times 10^{19}$ cm$^{-3}$.

The crystallinity of the high-concentration regions 604a_A, 604b_A, 604a_B, and 604b_B and the crystallinity of the low-concentration regions 608a_A, 608b_A, 608a_B, and 608b_B may be lower than that of the channel formation region.

The high-concentration regions 604a_A, 604b_A, 604a_B, and 604b_B and the low-concentration regions 608a_A, 608b_A, 608a_B, and 608b_B may contain an In—Ga—Zn—O—N-based material with a wurtzite crystal structure. In that case, such a wurtzite structure is more likely to be formed when the content of nitrogen in the high-concentration regions 604a_A, 604b_A, 604a_B, and 604b_B and the low-concentration regions 608a_A, 608b_A, 608a_B, and 608b_B is greater than or equal to $1 \times 10^{20}$ cm$^{-3}$ and less than 7 atomic %.

In the case where the impurity regions contain an In—Ga—Zn—O—N-based material with a wurtzite crystal structure, the resistance between the channel formation region and the source or drain of the transistor is reduced.

The conductive layers 605a_A, 605a_B, 605b_A, and 605b_B each function as the source or drain of the transistor. Note that a layer functioning as a source of a transistor can be called a source electrode or a source wiring, and a layer functioning as a drain of a transistor can be called a drain electrode or a drain wiring.

As the conductive layers 605a_A, 605a_B, 605b_A, and 605b_B, a layer of a metal material such as aluminum, chromium, copper, tantalum, titanium, molybdenum, or tungsten or an alloy material containing any of the above metal materials as its main component can be used, for example. As the layer of the alloy material, a layer of a Cu—Mg—Al alloy material can be used, for example.

A layer containing a conductive metal oxide can also be used as the conductive layers 605a_A, 605a_B, 605b_A, and 605b_B. The conductive metal oxide applicable to the conductive layers 605a_A, 605a_B, 605b_A, and 605b_B may contain silicon oxide.

Further, a layer of an In—Ga—Zn—O—N-based material can also be used as the conductive layers 605a_A, 605a_B, 605b_A, and 605b_B, which is preferable because the electrical conductivity of the layer of the In—Ga—Zn—O—N-based material is high.

Moreover, the conductive layers 605a_A, 605a_B, 605b_A, and 605b_B can be formed using a stack of layers containing materials applicable to these conductive layers. For example, the conductive layers 605a_A, 605a_B, 605b_A, and 605b_B can be formed using a stack of a layer of a Cu—Mg—Al alloy material and a copper layer thereon, whereby the adhesion to the insulating layer which is in contact with the conductive layers 605a_A, 605a_B, 605b_A, and 605b_B can be increased.

As the insulating layers 606_A and 606_B, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 606_A and 606_B can be formed using a stack of layers containing materials applicable to these insulating layers.

As the insulating layers 606_A and 606_B, an insulating layer of a material containing, for example, an element that belongs to Group 13 in the periodic table and oxygen can also be used.

Examples of the material containing an element that belongs to Group 13 and oxygen are gallium oxide, aluminum oxide, aluminum gallium oxide, and gallium aluminum oxide. Aluminum gallium oxide refers to a substance in which the amount of aluminum is larger than that of gallium in atomic percent, and gallium aluminum oxide refers to a substance in which the amount of gallium is larger than or equal to that of aluminum in atomic percent.

The conductive layers 607_A, 607_B, and 607_C each function as a gate of the transistor. Such a conductive layer functioning as the gate of the transistor can be called a gate electrode or a gate wiring.

As the conductive layers 607_A, 607_B, and 607_C, a layer of a metal material such as aluminum, chromium, copper, tantalum, titanium, molybdenum, or tungsten; or an alloy material containing the metal material as a main component can be used, for example. The conductive layers 607_A, 607_B, and 607_C can be formed using a stack of layers containing materials applicable to these conductive layers.

A layer containing a conductive metal oxide can also be used as the conductive layers 607_A, 607_B, and 607_C. The conductive metal oxide applicable to the conductive layers 607_A, 607_B, and 607_C may contain silicon oxide. The conductive metal oxide applicable to the conductive layers 607_A, 607_B, and 607_C may contain nitrogen, in which case the electrical conductivity can be increased.

Further, a layer of an In—Ga—Zn—O—N-based material can be used as the conductive layers 607_A, 607_B, and 607_C. The layer of an In—Ga—Zn—O—N-based material has high electrical conductivity and is thus suitable for the conductive layers 607_A, 607_B, and 607_C.

As the insulating layers 609a_A, 609b_A, 609a_B, and 609b_B, a layer of a material applicable to the insulating layers 606_A and 606_B can be used, for example. The insulating layers 609a_A, 609b_A, 609a_B, and 609b_B may be formed using a stack of layers containing materials applicable to these insulating layers.

Next, as an example of a method for manufacturing the transistor in this embodiment, an example of a method for manufacturing the transistor illustrated in FIG. 4A will be described with reference to FIGS. 5A to 5E. FIGS. 5A to 5E are cross-sectional views illustrating an example of a method for manufacturing the transistor in this embodiment.

Figure 5A:
FIGS. 5A to 5E illustrate steps for manufacturing a semiconductor device.

First, as illustrated in FIG. 5A, the semiconductor layer 603_A is formed over the insulating layer 601_A serving as a first insulating layer.

An example of a method for forming an oxide semiconductor layer with improved crystallinity as one example of the semiconductor layer 603_A is described below.

The method for forming the oxide semiconductor layer includes a step of forming a semiconductor film over the insulating layer 601_A and a step of performing heat treatment at least one time. The example of the method for forming the semiconductor layer 603_A may include a step of removing part of the semiconductor film. In that case, there is no particular limitation on the timing of the step of removing part of the semiconductor film as long as the step is performed after the semiconductor film is formed and before the conductive layers 605a_A and 605b_A are formed. Further, there is no particular limitation on the timing of the step of performing heat treatment as long as the heat treatment is performed after formation of the semiconductor film.

In the step of forming a semiconductor film over the insulating layer 601_A, for example, the semiconductor film is formed by forming a film of a material applicable to the semiconductor layer 603_A by sputtering. In that step, the temperature of the surface where the film is to be formed (the substrate side) is set higher than or equal to 100° C. and lower than or equal to 500° C.

In the case where the semiconductor layer 603_A is formed by sputtering, water and hydrogen existing in a deposition chamber are reduced as much as possible. Specifically, for example, it is preferable to heat the inside of the deposition chamber before deposition, to reduce the concentration of water and/or hydrogen in a gas introduced into the deposition chamber, and to prevent the counter flow of gas exhausted from the deposition chamber.

In the step of performing heat treatment, for example, heat treatment at temperatures ranging from 400° C. to 750° C. (also called heat treatment A) is performed. There is no particular limitation on the timing of the heat treatment A as long as it is after formation of the semiconductor film. Heat treatment performed on the semiconductor layer 603_A can eliminate moisture or hydrogen in the semiconductor layer 603_A.

Moreover, the heat treatment A causes crystallization from a top surface of the semiconductor film; crystal growth proceeds from the top surface toward the inside of the semiconductor film.

As a heat treatment apparatus for the heat treatment A, it is possible to use an electric furnace or an apparatus for heating an object by heat conduction or heat radiation from a heating element such as a resistance heating element; for example, a rapid thermal anneal (RTA) apparatus such as a gas rapid thermal anneal (GRTA) apparatus or a lamp rapid thermal anneal (LRTA) apparatus. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, a rare gas or an inert gas (e.g., nitrogen) which does not react with the object by the heat treatment can be used.

Note that it is preferable that in the heat treatment A, moisture, hydrogen, or the like be not contained in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

Through the above steps, the oxide semiconductor film becomes a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, a reduction in electron mobility, due to the grain boundary, is suppressed in the CAAC-OS film.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that directions of the a-axes and the b-axes may vary between different crystal parts. In this specification, the term "perpendicular" includes a range from 85° to 95°. In addition, the term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film. The crystal part is formed by deposition or by performing treatment for crystallization, such as heat treatment, after deposition.

With the use of the CAAC-OS film in a transistor, change in electric characteristics of the transistor due to irradiation with visible light or ultraviolet light can be reduced. Consequently, a transistor having stable electric characteristics can be formed.

A film surface on which the CAAC-OS film is deposited (the deposition surface) is preferably flat. This is because the c-axes of crystal parts in the CAAC-OS film are substantially perpendicular to the deposition surface, and thus irregularities of the deposition surface cause grain boundaries in the CAAC-OS film. For that reason, the deposition surface is preferably subjected to planarization such as chemical mechanical polishing (CMP) before the CAAC-OS film is formed. The average roughness of the deposition surface is preferably 0.5 nm or less, further preferably 0.3 nm or less.

Here, the CAAC-OS will be described in detail with reference to FIGS. 6A to 6E, FIGS. 7A to 7C, and FIGS. 8A to 8C. In FIGS. 6A to 6E, FIGS. 7A to 7C, and FIGS. 8A to 8C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). In FIGS. 6A to 6E, O surrounded by a circle represents tetracoordinate O and O surrounded by a double circle represents tricoordinate O.

Figure 6A:
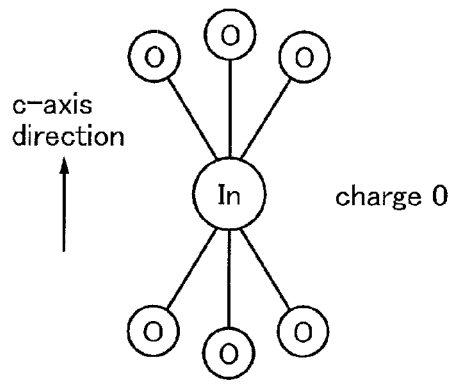
FIGS. 6A to 6E each illustrate a structure of an oxide material according to one embodiment of the present invention.

FIG. 6A illustrates a structure including one hexacoordinate In atom and six tetracoordinate oxygen (hereinafter referred to as tetracoordinate O) atoms proximate to the In atom. A structure including one In atom and oxygen atoms proximate to the In atom is called a subunit here. The structure in FIG. 6A is an octahedral structure, but is illustrated as a planar structure for simplicity. Note that three tetracoordinate O atoms exist in each of the upper half and the lower half in FIG. 6A. The electric charge of the subunit in FIG. 6A is 0.

Figure 6D:
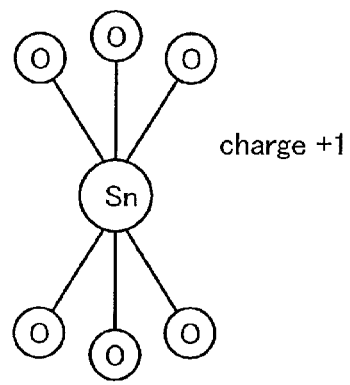
Figure 6B:
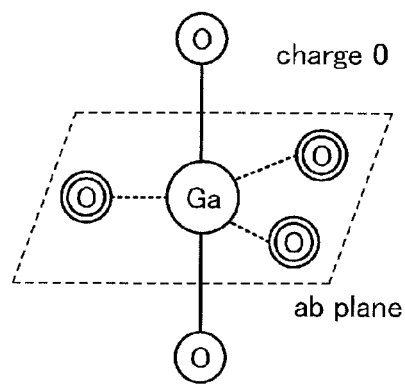

FIG. 6B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 6B. An In atom can also have the structure illustrated in FIG. 6B because the In atom can have five ligands. The electric charge of the subunit in FIG. 6B is 0.

Figure 6E:
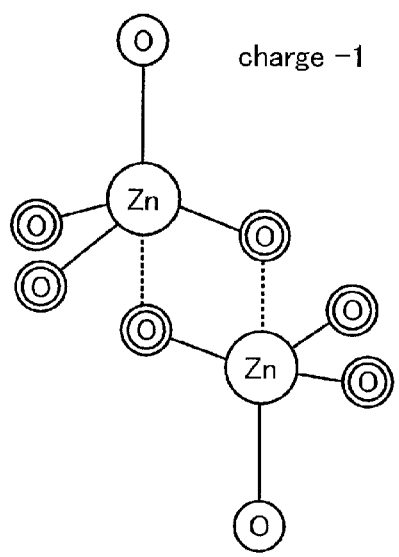
Figure 6C:
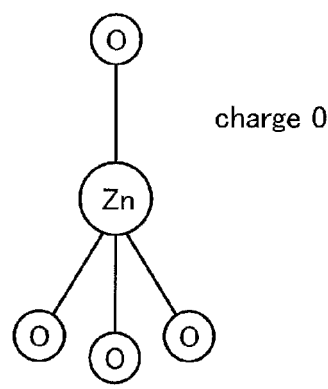

FIG. 6C illustrates a structure including one tetracoordinate Zn atom and four tetracoordinate O atoms proximate to the Zn atom. In FIG. 6C, one tetracoordinate O atom exists in the upper half and three tetracoordinate O atoms exist in the lower half. The electric charge of the subunit in FIG. 6C is 0.

FIG. 6D illustrates a structure including one hexacoordinate Sn atom and six tetracoordinate O atoms proximate to the Sn atom. In FIG. 6D, three tetracoordinate O atoms exist in each of the upper half and the lower half. The electric charge of the subunit in FIG. 6D is +1.

FIG. 6E illustrates a subunit including two Zn atoms. In FIG. 6E, one tetracoordinate O atom exists in each of the upper half and the lower half. The electric charge of the subunit in FIG. 6E is −1.

Here, an aggregation of several subunits is referred to as one group, and a plurality of groups constituting one period of a pattern are referred to as one unit.

Now, a rule of bonding between the subunits will be described. The three O atoms in the upper half with respect to the hexacoordinate In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of subunits including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, subunits are bonded to each other so that the total electric charge of the layered structure is 0, thereby forming one group.

FIG. 7A illustrates a model of one group included in a layered structure of an In—Sn—Zn—O-based material. FIG. 7B illustrates a unit including three groups. FIG. 7C illustrates an atomic arrangement where the layered structure in FIG. 7B is observed from the c-axis direction.

In FIG. 7A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 7A, one tetracoordinate O atom existing in each of an upper half and a lower half with respect to an In atom is denoted by circled 1. FIG. 7A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of the In—Sn—Zn—O-based material in FIG. 7A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a subunit that includes two Zn atoms and is proximate to one tetracoordinate O atom in an upper half, and the subunit is bonded to a Sn atom proximate to three tetracoordinate O atoms in each of an upper half and a lower half through one tetracoordinate O atom in a lower half with respect to the subunit. A plurality of such groups are bonded to form the unit, corresponding to one period of the pattern.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a subunit including a Sn atom is +1. Therefore, electric charge of −1, which cancels +1, is needed to form a layered structure including a Sn atom. As a structure having electric charge of −1, the subunit including two Zn atoms as illustrated in FIG. 6E can be given. For example, with one subunit including two Zn atoms, electric charge of one small group including a Sn atom can be cancelled, so that the total electric charge of the layered structure can result in 0.

An In atom can have either five ligands or six ligands. Specifically, when the unit illustrated in FIG. 7B is repeated is formed, In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number). The variable m is preferably large because the larger the variable m, the higher the crystallinity of the In—Sn—Zn—O-based crystal.

The same applies to the case of using any of the following oxides, for example: an oxide of four metal elements, such as an In—Sn—Ga—Zn—O-based oxide; an oxide of three metal elements, such as an In—Ga—Zn—O-based oxide (IGZO), an In—Al—Zn—O-based oxide, a Sn—Ga—Zn—O-based oxide, an Al—Ga—Zn—O-based oxide, and a Sn—Al—Zn—O-based oxide; an oxide of two metal elements, such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, and an In—Ga—O-based oxide; and an oxide of one metal element, such as an In—O-based oxide, a Sn—O-based oxide, and a Zn—O-based oxide.

Figure 8A:
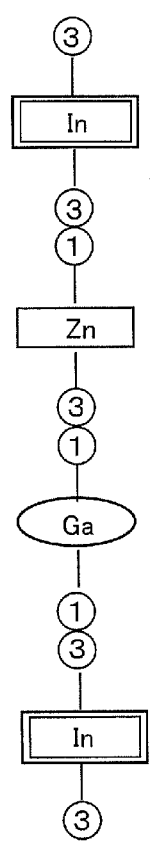
FIGS. 8A to 8C illustrate a structure of an oxide material according to one embodiment of the present invention.

As an example, FIG. 8A illustrates a model of one group included in a layered structure of an In—Ga—Zn—O-based material.

In the group included in the layered structure of the In—Ga—Zn—O-based material in FIG. 8A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such groups are bonded to form a unit, corresponding to one period of the pattern.

Figure 8B:
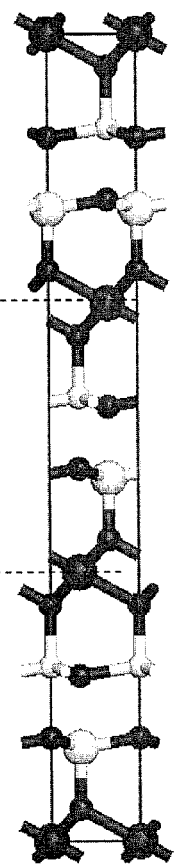
Figure 8C:
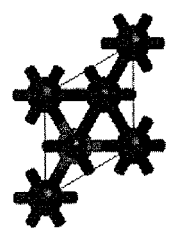

FIG. 8B illustrates a unit including three groups. FIG. 8C illustrates an atomic arrangement where the layered structure in FIG. 8B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a subunit including any of an In atom, a Zn atom, and a Ga atom is 0. As a result, the total electric charge of a group having a combination of these subunits is always 0.

In order to form the layered structure of the In—Ga—Zn—O-based material, a unit can be formed using not only the group illustrated in FIG. 8A but also a unit in which the arrangement of the In atom, the Ga atom, and the Zn atom is different from that in FIG. 8A.

Figure 5B:
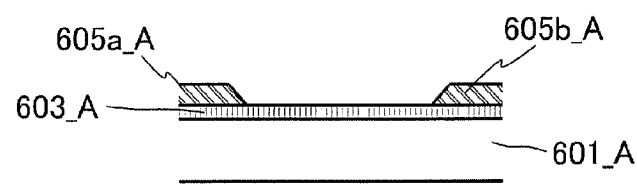

Next, as illustrated in FIG. 5B, a first conductive film is formed over part of the semiconductor layer 603_A and is partly etched to form the conductive layers 605a_A and 605b_A.

For example, the first conductive film can be formed by forming a layer of a material applicable to the conductive layers 605a_A and 605b_A by sputtering or the like. Alternatively, a plurality of films of materials applicable to the conductive layers 605a_A and 605b_A can be stacked to form the first conductive film.

In the case where a film is partly etched in the example of the method for manufacturing the transistor in this embodiment, for example, a resist mask may be formed over part of the film through photolithography and the film may be etched using the resist mask as in the method for forming the conductive layers 605a_A and 605b_A. In that case, the resist mask is preferably removed after the etching.

The conductive layer serving as the conductive layers 605a_A and 605b_A can be formed using an element selected from aluminum, chromium, copper, tantalum, titanium, molybdenum, or tungsten; an alloy containing any of these elements; an alloy containing the above elements in combination; and the like. Alternatively, the conductive layer may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material so as to prevent a heat resistance problem and a corrosion problem. As the refractory metal material, molybdenum, titanium, chromium, tantalum, tungsten, neodymium, scandium, yttrium, or the like can be used.

The conductive layer serving as the conductive layers 605a_A and 605b_A may have a single-layer structure or a layered structure of two or more layers. For example, the conductive layer may have a single-layer structure of an aluminum film containing silicon, a two-layer structure in which a titanium film is stacked over an aluminum film, or a three-layer structure in which a titanium film, an aluminum film, and a titanium film are stacked in this order. A Cu—Mg—Al alloy, a Mo—Ti alloy, Ti, and Mo have high adhesiveness with an oxide film. For that reason, when the conductive layers 605a_A and 605b_A have a layered structure in which a conductive film of Cu is stacked over a conductive film of a Cu—Mg—Al alloy, a Mo—Ti alloy, Ti, or Mo, the adhesion between an insulating layer which is an oxide film and the conductive layers 605a_A and 605b_A can be increased.

The conductive layer serving as the conductive layers 605a_A and 605b_A may be formed using a conductive metal oxide. As a conductive metal oxide, indium oxide, tin oxide, zinc oxide, indium oxide-tin oxide, indium oxide-zinc oxide, or any of the metal oxide materials to which silicon or silicon oxide is added can be used.

Figure 5C:
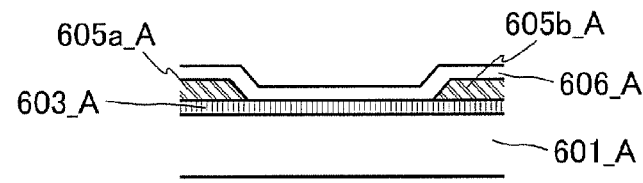

Next, as illustrated in FIG. 5C, a second insulating film is formed over the semiconductor layer 603_A and the conductive layers 605a_A and 605b_A to form the insulating layer 606_A.

For example, the second insulating film can be formed by forming a film of a material applicable to the insulating layer 606_A by sputtering, plasma-enhanced CVD, or the like. A plurality of films of materials applicable to the insulating layer 606_A may be stacked to form the second insulating film. Further, the insulating layer 606_A can also be formed by forming a film of a material applicable to the insulating layer 606_A by high-density plasma-enhanced CVD (e.g., high-density plasma-enhanced CVD using microwaves with a frequency of 2.45 GHz); in that case, the film density of the insulating layer 606_A becomes high, leading to improvement in the withstand voltage of the insulating layer 606_A.

Note that the insulating layer 606_A in contact with the semiconductor layer 603_A may be formed using an insulating material containing a Group 13 element and oxygen. Many of oxide semiconductor materials contain a Group 13 element, and an insulating material containing a Group 13 element works well with oxide semiconductors. By using an insulating material containing a Group 13 element for an insulating film in contact with the semiconductor layer, the state of the interface between the semiconductor layer and the insulating film can be kept favorable.

An insulating material containing a Group 13 element refers to an insulating material containing one or more elements that belong to Group 13. Examples of the material containing a Group 13 element are gallium oxide, aluminum oxide, aluminum gallium oxide, and gallium aluminum oxide. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, when an insulating layer is formed in contact with a semiconductor layer containing gallium, the use of a material containing gallium oxide for the insulating layer makes it possible to keep characteristics at the interface between the semiconductor layer and the insulating layer favorable. For instance, the semiconductor layer and an insulating layer containing gallium oxide are provided in contact with each other, so that pile up of hydrogen at the interface between the semiconductor layer and the insulating layer can be reduced. Note that a similar effect can be obtained in the case where an element in the same group as a constituent element of the oxide semiconductor is used in an insulating layer. For example, it is effective to form an insulating layer with the use of a material containing aluminum oxide. Note that water is less likely to permeate aluminum oxide, and it is therefore preferable to use a material containing aluminum oxide in terms of preventing entry of water to the semiconductor layer.

The insulating layer in contact with the semiconductor layer 603_A preferably contains oxygen in a proportion higher than that in the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by ion implantation or ion doping.

For example, in the case where the insulating layer in contact with the semiconductor layer 603_A is formed using gallium oxide, the composition of gallium oxide can be set to be $Ga_2O_x$ ($x=3+\alpha$, $0<\alpha<1$) by heat treatment in an oxygen atmosphere or oxygen doping.

In the case where the insulating layer in contact with the semiconductor layer 603_A is formed using aluminum oxide, the composition of aluminum oxide can be set to be $Al_2O_x$ ($x=3+\alpha$, $0<\alpha<1$) by heat treatment in an oxygen atmosphere or oxygen doping.

In the case where the insulating layer in contact with the semiconductor layer 603_A is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or oxygen doping.

By oxygen doping, an insulating layer including a region where the proportion of oxygen is higher than that in the stoichiometric composition can be formed. When the insulating layer including such a region is in contact with the semiconductor layer, excess oxygen in the insulating layer is supplied to the semiconductor layer, and oxygen defects in the semiconductor layer or at the interface between the semiconductor layer and the insulating layer are reduced. Thus, the semiconductor layer can be made to be an i-type or substantially i-type oxide semiconductor.

Figure 5D:
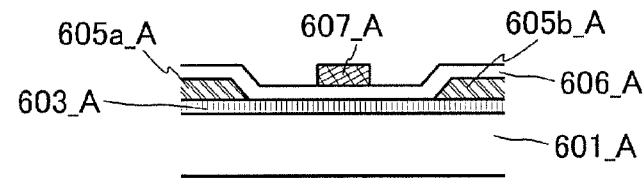

Then, as illustrated in FIG. 5D, a second conductive film is formed over the insulating layer 606_A and is partly etched to form the conductive layer 607_A.

For example, the second conductive film can be formed by forming a film of a material applicable to the conductive layer 607_A by sputtering. Alternatively, the second conductive film can be formed by stacking layers each formed using a material applicable to the second conductive film.

When a high-purity gas from which impurities such as hydrogen, water, a hydroxyl group, or a hydride are removed is used as a sputtering gas, the impurity concentration of the film can be reduced.

Note that heat treatment (also referred to as heat treatment B) may be performed in a preheating chamber of a sputtering apparatus before the film is formed by sputtering. With the heat treatment B, impurities such as hydrogen and moisture can be eliminated.

Before the film is formed by sputtering, for example, it is possible to perform treatment (also called reverse sputtering) by which voltage is applied to a side of a surface on which the film is to be formed, not to a target side, in an argon, nitrogen, helium, or oxygen atmosphere with the use of an RF power source and plasma is generated so that the surface on which the film is formed is modified. With reverse sputtering, powdery substances (also called particles or dust) attached to the surface on which the film is formed can be removed.

In the case where the film is formed by sputtering, moisture remaining in a deposition chamber for the film can be removed by an entrapment vacuum pump or the like. As the entrapment vacuum pump, a cryopump, an ion pump, or a titanium sublimation pump can be used, for example. Moreover, moisture remaining in the deposition chamber can be removed with a turbo pump provided with a cold trap.

In addition, after the insulating layer 606_A is formed, heat treatment (also referred to as heat treatment C) may be performed in an inert gas atmosphere or an oxygen gas atmosphere. The heat treatment C can be performed at temperatures ranging, for example, from 200° C. to 400° C., preferably from 250° C. to 350° C.

Figure 5E:
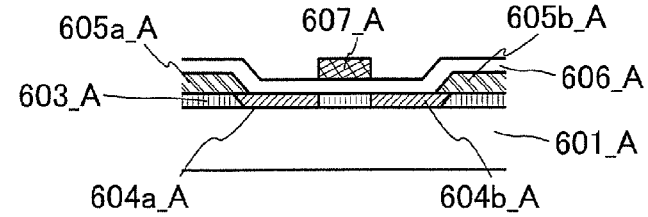

Next, as illustrated in FIG. 5E, dopant is added into the semiconductor layer 603_A, so that the high-concentration regions 604a_A and 604b_A are formed.

For example, the dopant can be added with the use of an ion doping apparatus or an ion implantation apparatus.

As the dopant, one or more of nitrogen, phosphorus, arsenic, argon, xenon, helium, and hydrogen can be used, for example.

Heat treatment may be performed after the dopant is added into the semiconductor layer 603_A.

The above is an example of the method for manufacturing the transistor illustrated in FIG. 4A.

In this embodiment, with the top-gate structure in which the source and drain regions are formed in a self-aligned manner using the gate electrode, the thin film transistor can be miniaturized, which can avoid an overlap between the gate electrode and the source and drain electrodes of the thin film transistor.

By the above-described process, the semiconductor layer 603_A can be highly purified by sufficiently reducing the hydrogen concentration, and have reduced defect levels in the energy gap due to oxygen vacancies by sufficiently supplying oxygen. Consequently, the carrier concentration of the semiconductor layer can be extremely low, which provides the thin film transistor with extremely low off-state current. When such a thin film transistor with extremely low off-state current is used as the thin film transistor in Embodiment 1, the thin film transistor can be considered substantially as an insulator when turned off. Accordingly, the use of such a thin film transistor as the thin film transistor 101 can suppress the reduction in the potential held in the data retention portion D_HOLD to an extremely low level. As a result, variation in the potential of the data retention portion D_HOLD can be small.

This embodiment can be implemented in appropriate combination with the structures described in the other embodiment.

EXPLANATION OF REFERENCE

100: semiconductor device, 101: thin film transistor, 102: current amplifier circuit, 103: field-effect transistor, 104: bipolar transistor, 105: capacitor, 111: p-channel transistor, 112: n-channel transistor, 113: p-channel transistor, 114: n-channel transistor, 115: p-channel transistor, 116: n-channel transistor, 117: n-channel transistor, 118: resistor, 119: n-channel transistor, 120: resistor, 601_A: insulating layer, 601_B: insulating layer, 603_A: semiconductor layer, 603_B: semiconductor layer, 604a_A: high-concentration region, 604b_A: high-concentration region, 604a_B: high-concentration region, 604b_B: high-concentration region, 605a_A: conductive layer, 605a_B: conductive layer, 605b_A: conductive layer, 605b_B: conductive layer, 606_A: insulating layer, 606_B: insulating layer, 607_A: conductive layer, 607_B: conductive layer, 607_C: conductive layer, 608a_A: low-concentration region, 608b_A: low-concentration region, 608a_B: low-concentration region, 608b_B: low-concentration region, 609a_A: insulating layer, 609a_B: insulating layer, 609b_A: insulating layer, 609b_B: insulating layer This application is based on Japanese Patent Application serial No. 2011-103508 filed with Japan Patent Office on May 6, 2011, the entire contents of which are hereby incorporated by reference.

The invention claimed is:

1. A semiconductor device comprising:
a transistor comprising an oxide semiconductor layer including a channel formation region;
a current amplifier circuit comprising a field-effect transistor and a bipolar transistor; and
a capacitor electrically connected to a gate of the field-effect transistor,
wherein one of a source and a drain of the transistor is electrically connected to the gate of the field-effect transistor,
wherein one of a source and a drain of the field-effect transistor is electrically connected to a base of the bipolar transistor,
wherein the other of the source and the drain of the field-effect transistor is electrically connected to one of an emitter and a collector of the bipolar transistor, and
wherein the current amplifier circuit is configured to control an amount of current in accordance with data held in the capacitor.

2. The semiconductor device according to claim 1, wherein the data is supplied from the other of the source and the drain of the transistor.

3. The semiconductor device according to claim 1, further comprising a wiring,
wherein a gate of the transistor is connected to the wiring supplied with a control signal for controlling a conduction state of the transistor.

4. The semiconductor device according to claim 1, wherein the oxide semiconductor layer comprises an In—Ga—Zn based oxide semiconductor.

5. The semiconductor device according to claim 1, wherein the oxide semiconductor layer comprises an In—Sn—Zn based oxide semiconductor.

6. The semiconductor device according to claim 1, wherein off-state current density of the transistor is 100 zA/μm or less.

7. The semiconductor device according to claim 1, wherein the bipolar transistor is a PNP bipolar transistor, and
wherein the other of the source and the drain of the field-effect transistor is electrically connected to the collector of the PNP bipolar transistor.

8. A semiconductor device comprising:
a transistor comprising an oxide semiconductor layer including a channel formation region;
a current amplifier circuit comprising a field-effect transistor and a bipolar transistor; and
a capacitor electrically connected to a gate of the field-effect transistor,
wherein one of a source and a drain of the transistor is electrically connected to the gate of the field-effect transistor,
wherein one of a source and a drain of the field-effect transistor is electrically connected to a base of the bipolar transistor,
wherein the field-effect transistor and the bipolar transistor are electrically connected as a Darlington pair, and
wherein the current amplifier circuit is configured to control an amount of current in accordance with data held in the capacitor.

9. The semiconductor device according to claim 8, wherein the data is supplied from the other of the source and the drain of the transistor.

10. The semiconductor device according to claim 8, further comprising a wiring,
wherein a gate of the transistor is connected to the wiring supplied with a control signal for controlling a conduction state of the transistor.

11. The semiconductor device according to claim 8, wherein the oxide semiconductor layer comprises an In—Ga—Zn based oxide semiconductor.

12. The semiconductor device according to claim 8, wherein the oxide semiconductor layer comprises an In—Sn—Zn based oxide semiconductor.

13. The semiconductor device according to claim 8, wherein off-state current density of the transistor is 100 zA/μm or less.

14. The semiconductor device according to claim 8, wherein the bipolar transistor is a PNP bipolar transistor.

* * * * *